United States Patent

Morita et al.

[11] Patent Number: 5,326,014
[45] Date of Patent: Jul. 5, 1994

[54] HEAD OF ULTRASONIC WIRE BONDING APPARATUS AND BONDING METHOD

[75] Inventors: Makoto Morita, Neyagawa; Masaru Nagaike, Hirakata, both of Japan

[73] Assignee: Matsushita Electric Industrial Co., Ltd., Osaka, Japan

[21] Appl. No.: 140,519

[22] Filed: Oct. 25, 1993

[30] Foreign Application Priority Data

Oct. 26, 1992 [JP] Japan .................. 4-287344

[51] Int. Cl.$^5$ ........................ H01L 21/607
[52] U.S. Cl. ................... 228/110.1; 228/1.1
[58] Field of Search ........... 228/110.1, 180.5, 1.1, 228/4.5; 219/56.21, 56.22; 156/73.2, 379.6, 580.1

[56] References Cited

U.S. PATENT DOCUMENTS

| | | | |
|---|---|---|---|
| 4,040,885 | 8/1977 | Hight et al. | 228/1.1 |
| 5,037,023 | 8/1991 | Akiyama et al. | 228/180.5 |
| 5,176,310 | 1/1993 | Akiyama et al. | 228/180.5 |
| 5,263,630 | 11/1993 | Kanomata et al. | 228/1.1 |

FOREIGN PATENT DOCUMENTS 58-55664 12/1983 Japan .
64-3053 1/1989 Japan .

Primary Examiner—Samuel M. Heinrich
Attorney, Agent, or Firm—Wenderoth, Lind & Ponack

[57] ABSTRACT

A head of an ultrasonic wire bonding apparatus for bonding a lead wire to a lead frame, includes a capillary, a capillary supporting member, and a vibrator, vertically arranged and connected to the capillary supporting member, for producing ultrasonic torsional vibration along opposite directions and applying the vibration to the capillary via the capillary supporting member, the vibrator having two piezoelectric elements superimposed on each other via a column member in which magnets are circularly arranged so as to produce the ultrasonic torsional vibration along the opposite directions.

4 Claims, 6 Drawing Sheets

HEAD OF ULTRASONIC WIRE BONDING APPARATUS AND BONDING METHOD

BACKGROUND OF THE INVENTION

The present invention relates to a head of an ultrasonic wire bonding apparatus utilizing the vibration of a capillary by ultrasonic waves and a method for carrying out the bonding operation.

A conventional ultrasonic wire bonding apparatus using the vertical vibration is shown in FIG. 9. In the apparatus of FIG. 9, a capillary 2 is fixed perpendicularly to a horn 1 which vibrates in the vertical direction. A lead wire 6 is pressed to a bare chip 4 and a lead frame 5 placed on a work table 3 by the capillary 2 to which a minute pressure is applied. While the horn 1 is vibrated vertically by the ultrasonic waves, the bare chip 4 and the lead frame 5 are bonded by the lead wire 6.

In the above-described constitution, the size of the work table 3 for bonding is restricted depending on the length of the horn 1 due to the interference therebetween. Therefore, if the horn is elongated to widen the bonding range, the horn is bent and deflected. As a result, the horn starts vibrating up and down, which causes the damage of the bare chip. The bonding range is therefore impossible to be made wide in the conventional arrangement.

SUMMARY OF THE INVENTION

The object of the present invention is to provide a head of an ultrasonic wire bonding apparatus capable of increasing a bonding region with an aim to solve the aforementioned disadvantage inherent in the prior art.

In accomplishing these and other objects, according to a first aspect of the present invention, there is provided a head of an ultrasonic wire bonding apparatus for bonding a lead wire to a lead frame, comprising: a capillary; a capillary supporting member; and a vibrator, vertically arranged and connected to the capillary supporting member, for producing ultrasonic torsional vibration along opposite directions and applying the vibration to the capillary via the capillary supporting member, the vibrator having two piezoelectric elements superimposed on each other via a column member in which magnets are circularly arranged so as to produce the ultrasonic torsional vibration along the opposite directions.

According to a second aspect of the present invention, there is provided a method for bonding a lead wire of a substrate to a lead frame, comprising steps of: producing electric discharge by a torch; forming a ball on a lower end of a wire supported by a capillary; moving on a substrate the capillary in a circular arc locus for bonding by ultrasonic torsional vibration along opposite directions produced by a vibrator, vertically arranged and connected to the capillary, for producing the ultrasonic torsional vibration along the opposite directions and applying the vibration to the capillary, the vibrator having two piezoelectric elements superimposed on each other via a column member in which magnets are circularly arranged so as to produce the ultrasonic torsional vibration along the opposite directions.

BRIEF DESCRIPTION OF THE DRAWINGS

These and other objects and features of the present invention will become clear from the following description taken in conjunction with one preferred embodiment thereof with reference to the accompanying drawings, in which.

DETAILED DESCRIPTION OF THE PREFERRED EMBODIMENT

Figure 1:
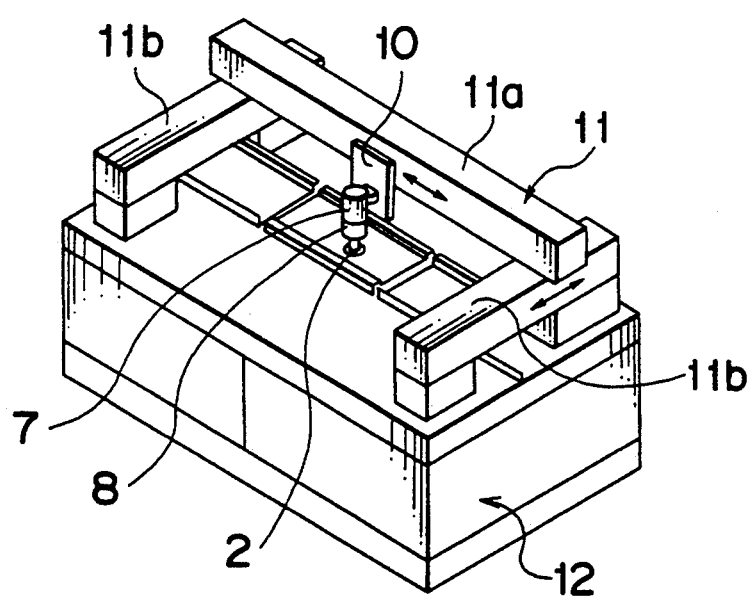
FIG. 1 is a structural diagram of an ultrasonic wire bonding apparatus having its head according to one embodiment of the present invention.

Before the description of the present invention proceeds, it is to be noted that like parts are designated by like reference numerals throughout the accompanying drawings.

A preferred embodiment of the present invention will be discussed hereinbelow with reference to the accompanying drawings.

FIGS. 1-5 shows an ultrasonic wire bonding apparatus 12 having a head of the apparatus according to an embodiment of the present invention. The apparatus 12 includes a bonding unit and a linear robot 11 for moving the bonding unit in X and Y axis directions with respect to a substrate to be bonded. The linear robot 11 has an X-axis driving device 11a for moving the bonding unit in X-axis direction with respect to the substrate and a Y-axis driving device 11b for moving the bonding unit in Y-axis direction with respect to the substrate. The bonding unit includes a vibrator 7 vertically arranged for producing ultrasonic torsional vibration; a vertical horn 8 vertically arranged and connected to the vibrator 7; a plate 9 for supporting a capillary 2 connected to the horn 8; a bonding head 10 for supporting the horn 8 connected to the X-axis driving device 11a. The vertical axes of the vibrator 7 and the horn 8 are preferably arranged perpendicular to the substrate.

Figure 2:
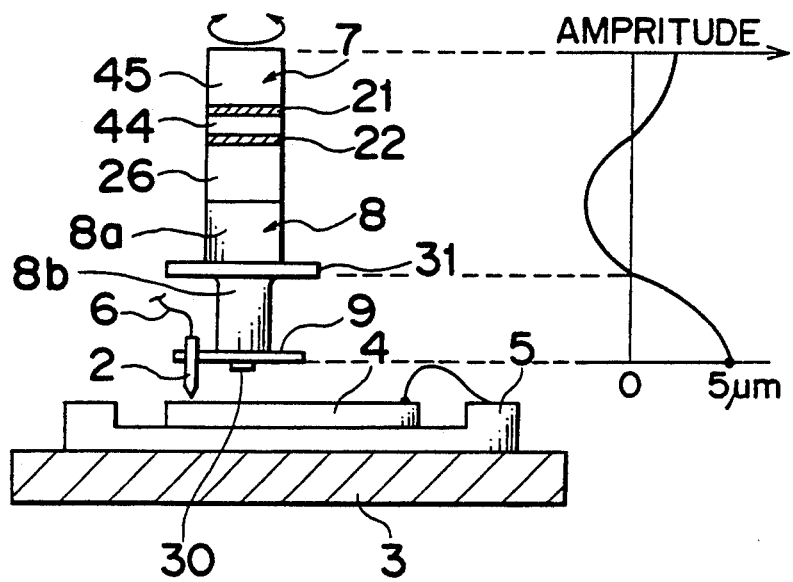
FIG. 2 is a substantial structural diagram for explaining the operation of the apparatus in FIG. 1.
Figure 5:
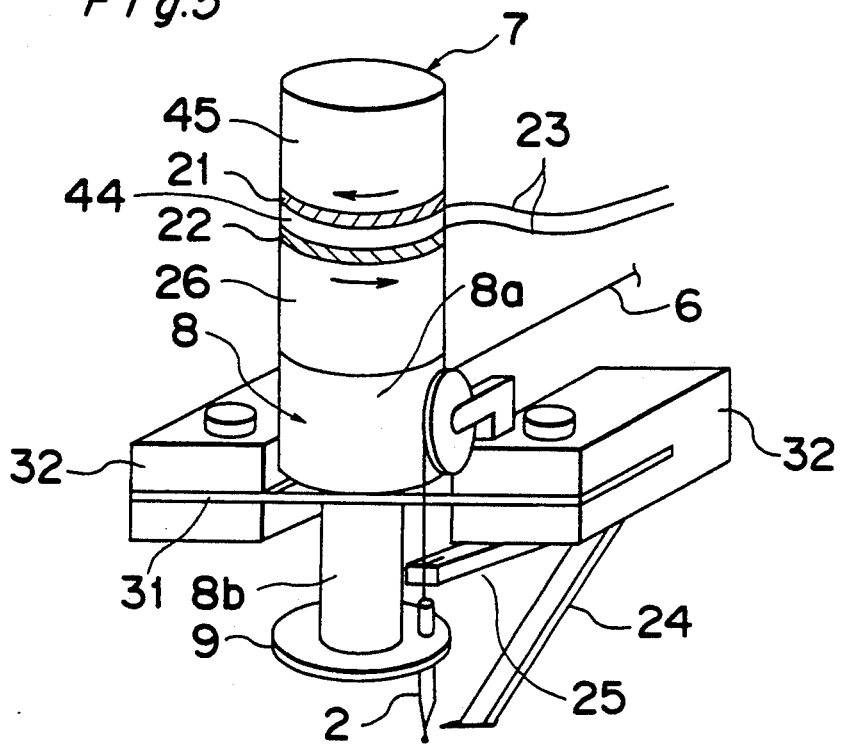
FIG. 5 is a perspective view of the head.
Figure 6:
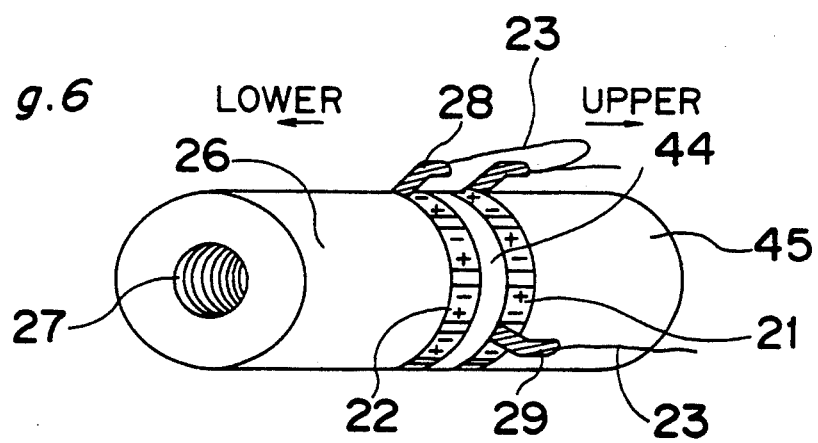
FIG. 6 is a perspective view of the vibrator.
Figure 7:
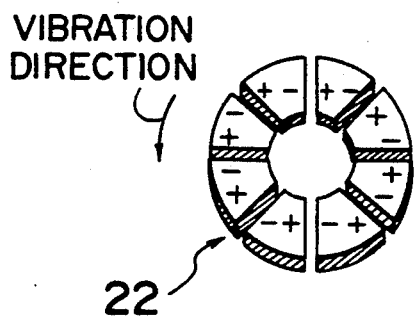
FIG. 7 and FIG. 8 are plan views of piezoelectric elements of the vibrator.
Figure 8:
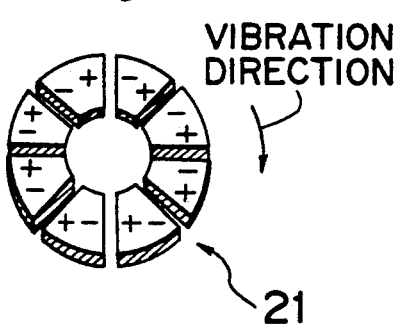
Figure 9:
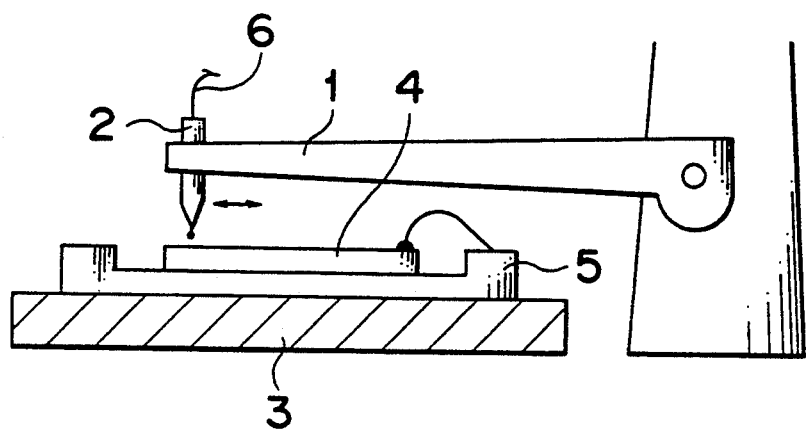
FIG. 9 is a structural diagram of a conventional ultrasonic wire bonding apparatus.

The vibrator 7 has two piezoelectric elements 21 and 22 made of ceramic which are held between front, middle, and rear column members 26, 44, and 45 preferably made of titanium as shown in FIGS. 2, 5, and 6 because of reducing thermal expansion. As shown in FIGS. 6 and 7, the poles of magnets in the piezoelectric elements 21 and 22 are circularly arranged in opposition to each other so that the vibration directions of the piezoelectric elements 21 and 22 can be opposite to each other. Therefore, when an electric power is supplied to the piezoelectric elements 21 and 22 through lead wires 23, torsional vibration is produced by alternatively supplying the electric power to the piezoelectric elements 21 and 22. Reference numeral 29 denotes a positive electrode and 28 a negative electrode.

The horn 8 preferably made of titanium because of reducing thermal expansion is arranged below the lower end of the front column member 26 so as to transfer torsional vibration produced by the vibrator 7 to the capillary 2. The horn 8 has an upper portion 8a with the same diameter as the vibrator 7, a lower portion 8b with the smaller diameter than the upper portion 8a, and a support plate 31 arranged between the upper and lower portions 8a and 8b. The support plate 31 is preferably located at a portion where the amplitude of the torsional vibration is zero as shown in FIG. 2. The support plate 31 of the horn 8 is connected to the bonding head 10 via support members 32 as shown in FIG. 5. In FIG. 5, reference numerals 24 and 25 denote a torch for heating the wire 6 and a clamper for clamping the wire 6, respectively.

The capillary 2 is arranged at the peripheral portion of the plate 9 with an offset 13 between the center axis of the plate 9 and the capillary 2 as shown in FIG. 2. The vibrator 8 and the plate 9 are connected to the upper end and the lower end of the horn 8 by passing a stainless steel bolt 30 through the plate 9 and the horn 8 and screwing into a screw hole 27 of the front column member 26 of the vibrator 7 so that the axes of the vibrator 7, the horn 8, and the plate 9 can be the same. Therefore, the torsional vibration produced by the vibrator 7 is transferred to the capillary 2 via the horn 8 and the plate 9. As a result, the capillary 2 is moved in circular arc shape. For example, when a bare chip 4 and a lead frame 5 both of which are of square of 50 $\mu$m $\times$ 50 $\mu$m are bonded by a gold wire 6 of 25 $\mu$m, the capillary 2 moves within a maximum of 5 $\mu$m along a circular arc locus by the torsional vibration of 60 Hz. The wire 6 is supplied to the capillary 2 as described later.

Figure 3:
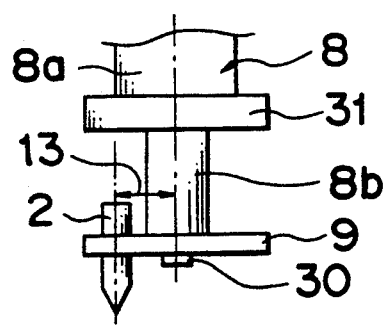
FIG. 3 and FIG. 4 are a side view and a bottom view of the lower portion of the head to explain a method for changing the magnification rate of the amplitude in the one embodiment of the present invention.
Figure 4:
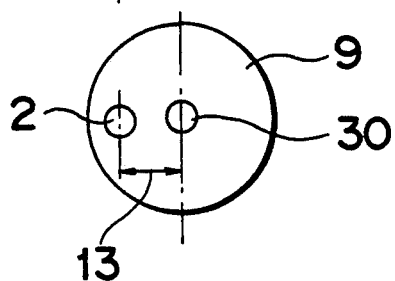

The operation of the ultrasonic wire bonding apparatus 12 in the above constitution will be described with reference to FIGS. 1 to 3. In the first place, when the linear robot 11 is moved, the bonding head 10 presses the capillary 2 with a minute pressure. The capillary 2 is supported by the plate 9 with the offset 13 from the central axis of the torsional vibration of the vertical horn 8 to the bare chip 4 and the lead from 5 on the work table 3. As the capillary 2 vibrates the vertical horn 8 with ultrasonic waves having the amplitude of approximately 5 $\mu$m on the peripheral surface thereof, the bare chip 4 and the lead frame 5 are bonded together by the lead wire 6.

When the offset 13 of the capillary 2 from the central axis of the torsional vibration of the vertical horn 8 is changed, the magnification rate of the amplitude is easily changed without exchanging the horn. The change of the offset 13 of the capillary 2 can be caused by changing an electric power to be supplied to the vibrator 7 can be changed or the diameter of the plate 9 for supporting the capillary 2.

Figure 10:
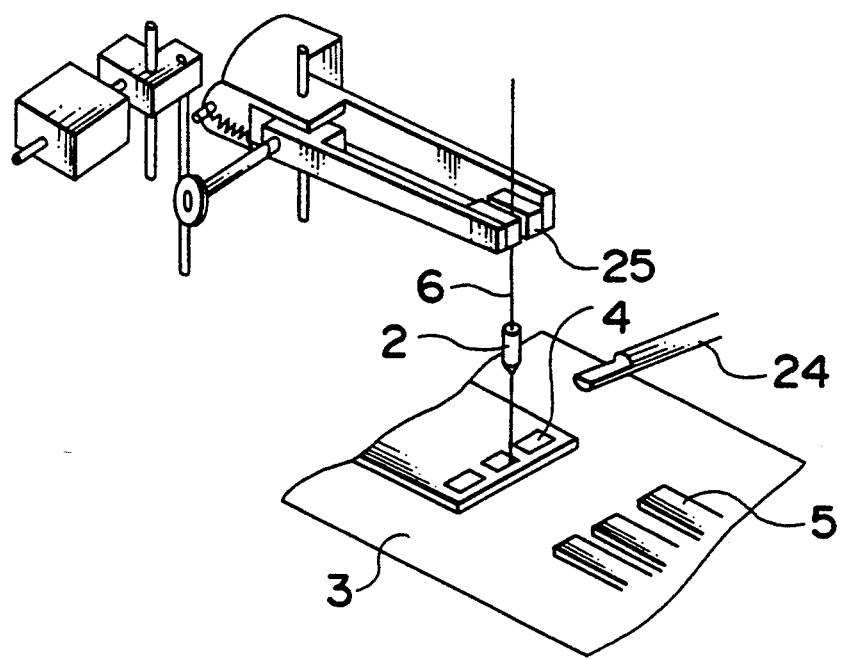
FIG. 10 is a perspective view of a conventional wire bonding apparatus.
Figure 11:
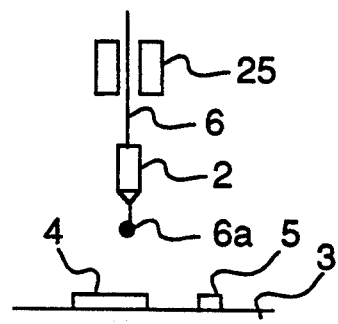
FIG. 11, FIG. 12, FIG. 13, FIG. 14, FIG. 15, FIG. 16, FIG. 17, FIG. 18, FIG. 19, FIG. 20, and FIG. 21 are views for explaining a bonding process, respectively.
Figure 12:
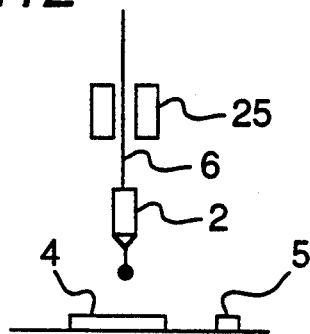
Figure 13:
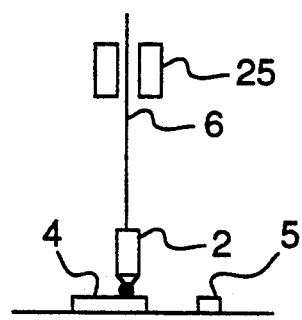

The bonding operation of the apparatus is similar to the conventional one which is described below. FIG. 11 through FIG. 21 show a bonding process in the conventional apparatus shown in FIG. 10. The process can be applied to the above ultrasonic wire bonding apparatus. In FIG. 11, showing a condition before bonding, a ball 6a of the wire 6 supported by the capillary 2 is formed at the lower end. As shown in FIG. 12, the capillary 2 and the clamper 25 are downward moved to a specified position. As shown in FIG. 13, the clamper 25 is stopped and only the capillary 2 is moved downward. The lower end of the wire 6 is bonded to a bare chip 4. When the capillary 2 and the clamper 25 start to move downward and the bonding is carried out, an electric current value for supplying to a solenoid is controlled to apply downward tension to the wire 6 by the clamper 25, so that the wire 6 slides downward through the clamper 25. When the tension is not applied, the wire 6 is held by the clamper 25. As the result, the following adverse operation can be prevented: in the condition shown in FIG. 11, when the wire 6 is sagged above the clamper 25 and the capillary 2 and the clamper 25 are downward moved, the ball 6a of the wire 6 is dropped by the sagged amount from the end of the capillary 2, so that bonding operation can not performed.

Figure 14:
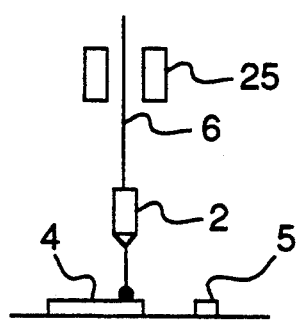
Figure 15:
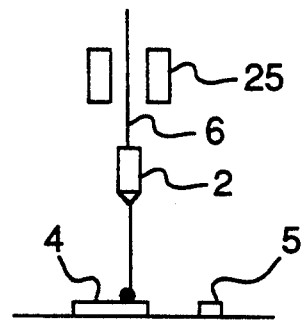
Figure 16:
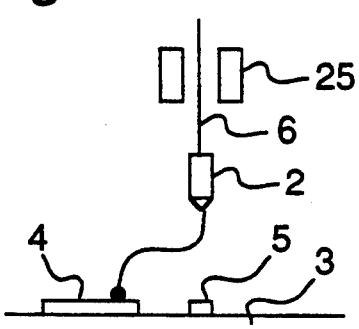
Figure 17:
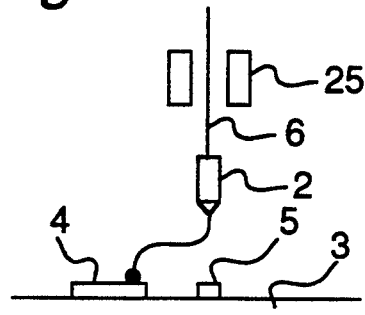
Figure 18:
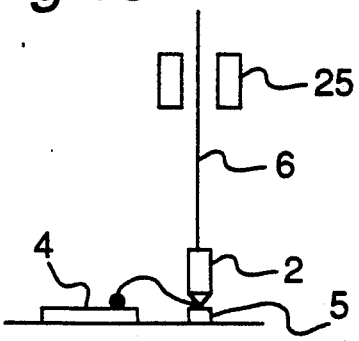
Figure 19:
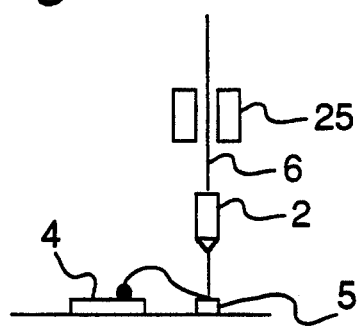
Figure 20:
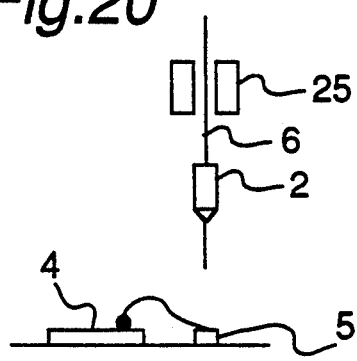
Figure 21:
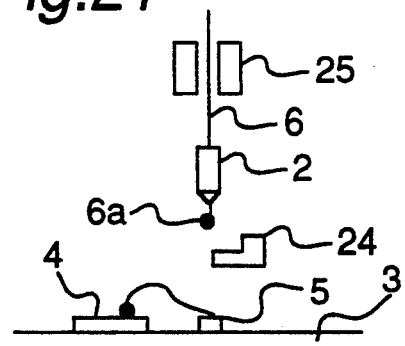

After the lower end of the wire 6 is bonded to the bare chip 4, as shown in FIG. 14, the electric power is stopped to be supplied to the solenoid, the wire 6 is released from the clamper 25, and only the capillary 2 is upward moved to a specified position. Thereafter, as shown in FIG. 15, the capillary 2 and the clamper 25 are upward moved and then the capillary 2 is positioned above the lead frame 5 as shown in FIG. 16. As shown in FIG. 17, the capillary 2 and the clamper 25 are downward moved to a specified position, and then, only the capillary 2 is downward moved as shown in FIG. 18, so that the wire 6 is bonded to the lead frame 5. As shown in FIG. 19, the wire 6 is clamped by the clamper 25 and only the capillary 2 is upward moved to a specified position. At that time, the force for clamping the wire 6 by the clamper 25 is set not to slide the wire 6 through the clamper 25 when tension is applied to the wire 6 by controlling an electric current value supplied to the solenoid. Then, as shown in FIG. 20, the capillary 2 and the clamper 25 are upward moved to a specified position, the wire 6 is cut at the portion near the lead frame 5. This cutting operation is carried out by the following reason. When the wire 6 is bonded to the lead frame 5 as shown in FIG. 18, the bonding portion of the wire 6 has flaw by the capillary 2 and then the bonding portion of the wire 6 with the flaw is cut by upward moving the clamper 25 as shown in FIG. 20. Since the clamper 25 clamps the wire 6 after cutting the wire 6, a specified length of the wire 6 is left at the lower end of the capillary 2. The lower end of the wire 6 is heated by an electric torch 24 as shown in FIG. 21, for example, at 280° C., so that the ball 6a is formed at the end of the wire 6. These operations are repeated to bond the bare chip 4 to the lead frame 5.

As described hereinabove, since the ultrasonic torsional vibration vibrator 7 is mounted to the vertical horn 8 having the capillary 2 with an offset 13 from the central axis of the torsional vibration of the vibrator 7, the interference of the horn 8 with the work table 3 is eliminated, thereby making it possible to widen the bonding range. Moreover, since the horn 8 is vertically arranged, it is prevented that the horn 8 is deflected. Accordingly, the present invention realizes bonding with high accuracy without damaging the bare chip.

Because of the arrangement that the capillary 2 is set on the plate 9 which is located at the front end of the vertical horn 8, the magnification rate of the amplitude can be changed easily by changing the amount of the offset 13 of the plate 9, without exchanging the horn 8.

Accordingly, the ultrasonic wire bonding apparatus of the present invention achieves highly accurate bonding in the widened range without damaging the bare chip.

Although the horn 8 allows the durability of the vibrator 7 to increase, the horn 8 can be omitted and then the vibrator 7 can be directly connected to the plate 9 for supporting the capillary 2.

The substrate, instead of the capillary 2, can is move in the X and Y-axis directions by a driving device such as the linear robot 11 while the capillary 2 is fixed.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A head of an ultrasonic wire bonding apparatus for bonding a lead wire to a lead frame, comprising:
    a capillary;
    a capillary supporting member; and
    a vibrator, vertically arranged and connected to the capillary supporting member, for producing ultrasonic torsional vibration along opposite directions and applying the vibration to the capillary via the capillary supporting member, the vibrator having two piezoelectric elements superimposed on each other via a column member in which magnets are circularly arranged so as to produce the ultrasonic torsional vibration along the opposite directions.

2. The head of the ultrasonic wire bonding apparatus as claimed in claim 1, further comprising a horn arranged between the capillary and the vibrator.

3. The head of the ultrasonic wire bonding apparatus as claimed in claim 1, wherein the capillary support member is detachably attached to the vibrator.

4. A method for bonding a lead wire of a substrate to a lead frame, comprising steps of:
    producing electric discharge by a torch;
    forming a ball on a lower end of a wire supported by a capillary;
    moving on a substrate the capillary in a circular arc locus for bonding by ultrasonic torsional vibration along opposite directions produced by a vibrator, vertically arranged and connected to the capillary, for producing the ultrasonic torsional vibration along the opposite directions and applying the vibration to the capillary, the vibrator having two piezoelectric elements superimposed on each other via a column member in which magnets are circularly arranged so as to produce the ultrasonic torsional vibration along the opposite directions.

* * * * *